United States Patent

Beck et al.

[11] Patent Number: 5,894,983
[45] Date of Patent: Apr. 20, 1999

[54] HIGH FREQUENCY, LOW TEMPERATURE THERMOSONIC RIBBON BONDING PROCESS FOR SYSTEM-LEVEL APPLICATIONS

[75] Inventors: Donald J. Beck; Kelly V. Hillman; Hector Deju, all of Palm Bay; Gary A. Rief; Thomas K. Buschor, both of Melbourne; James B. Nichols, Indialantic; Brett A. Pigon; Walter M. Whybrew, both of Palm Bay; Steven E. Wilson, West Melbourne, all of Fla.

[73] Assignee: Harris Corporation, Melbourne, Fla.

[21] Appl. No.: 08/781,541

[22] Filed: Jan. 9, 1997

[51] Int. Cl.$^6$ .................. H01L 21/60; H01L 20/10
[52] U.S. Cl. .................. 228/110.1; 228/180.5; 228/1.1
[58] Field of Search ................ 228/1.1, 110.1, 228/180.5

[56] References Cited

U.S. PATENT DOCUMENTS

| 3,734,386 | 5/1973 | Hazel | 228/1.1 |
|---|---|---|---|
| 5,054,680 | 10/1991 | Stockham | 228/180.5 |
| 5,201,454 | 4/1993 | Alfaro et al. | 228/110.1 |
| 5,244,140 | 9/1993 | Ramsey et al. | 228/110.1 |

FOREIGN PATENT DOCUMENTS

| 4-68548 | 3/1992 | Japan | 228/1.1 |
|---|---|---|---|
| 5-109808 | 4/1993 | Japan | 228/180.5 |

Primary Examiner—Patrick Ryan
Assistant Examiner—Jeffrey T. Knapp
Attorney, Agent, or Firm—Charles E. Wands

[57] ABSTRACT

A thermosonic ribbon bonding process uses a combination of a relatively low temperature and a high frequency to bond a ribbon conductor to conductive bonding sites of a system level support structure, such as a space/airborne antenna, containing circuit components whose characteristics might otherwise be degraded at an elevated temperature customarily used in device-level thermosonic bonding processes. By relatively low temperature is meant a temperature no greater than the minimum temperature that would potentially cause a modification of the circuit parameters of at least one of the system's components. Such a minimum temperature may lie in a range on the order of 25–85° C., while the ultrasonic bonding frequency preferably lies in a range of from 122 KHz to 140 KHz. For gold ribbon to gold pad bonds, this high frequency range achieves the requisite atomic diffusion bonding energy, without causing fracturing or destruction of the gold ribbon or its interface with the gold pad.

21 Claims, 2 Drawing Sheets

HIGH FREQUENCY, LOW TEMPERATURE THERMOSONIC RIBBON BONDING PROCESS FOR SYSTEM-LEVEL APPLICATIONS

CROSS-REFERENCE TO RELATED APPLICATIONS

The present invention relates to subject matter described in co-pending patent application Ser. No. 08/781,530, entitled: "Lightweight Antenna Subpanel Having RF Amplifier Modules Embedded in Honycomb Support Structure Between Radiation and Signal Distribution Networks," by S. Wilson et al, filed coincident herewith, assigned to the assignee of the present application and the disclosure of which is herein incorporated.

FIELD OF THE INVENTION

The present invention relates in general to the manufacture and assembly of microelectronic circuits and devices, and is particularly directed to a new and improved low temperature, high frequency thermosonic bonding technique for providing secure, ruggedized ribbon-configured interconnections among bonding sites of a plurality of components of a system-level microelectronic support structure, such as a spaceborne antenna structure, including but not limited to that described in the above-referenced co-pending Wilson et al application.

BACKGROUND OF THE INVENTION

Microelectronic circuit manufacturers employ various types of automated wiring equipment to electrically interconnect components of a signal processing system architecture. In addition to automated soldering of wires between components, thermosonic ball-bonding (of one mil diameter gold wire, for example) is sometimes used at the device level for connecting an integrated circuit, such as a microprocessor device, to interconnect leads of a support package or substrate.

In accordance with such a conventional thermosonic ball-bonding process, an integrated circuit (typically sized on the order of 0.3"×0.3"), is placed upon a substrate containing an array of metallized pads that geometrically correspond to the aluminum pads on the surface of the integrated circuit. The substrate is conductively heated to a relatively elevated temperature (on the order of at least 150° C.), usually by way of a heating plate upon which the substrate is supported and clamped, with pressure being applied upon the integrated circuit or attachment substrate.

Ultrasonic vibration (typically on the order of 60 KHz) is then imparted to the clamped structure by means a wire bonding head. During this process, the combination of the application of high temperature, pressure, and the moderate ultrasonic frequency abrasion of the metallic wire against the surface of the terminal pad metal is operative to effect metallurgical atomic diffusion bonding of the gold wire with the metal of the bonding sites.

Now, although thermosonic ball-bonding may be satisfactory for (hermetically sealed) intra-package interconnects at the device level, it is not satisfactory for system level interconnections among substrates and packaged electronic modules, such as antenna panel modules, which may cover a hardware component distribution area greater than 20"× 20", and are to exposed to the ambient environment. A principal shortcoming of a conventional high temperature, ball-bonding process to system-level interconnects is the fact that it is carried out at high temperature. While this may be acceptable for various intra-package lead-connection applications, it cannot be used at the system level, where the application of an elevated temperature, typically on the order of 150° C. or higher, to the system hardware may alter the design parameters of the internal circuitry of its components.

In addition, system level (module-to-module) interconnect, which is typically configured other than a small diameter wire and can be expected to be exposed to the environment, is required to withstand harsh storage, transportation and operating conditions. As a consequence, system level interconnect must be mechanically more robust than the reduced size (one mil) diameter metallic wires used for (hermetically sealed) internal package connections. Moreover, RF signal processing systems require a beam lead type of interconnect, so that the shapes and lengths of the interconnects must be carefully tailored to achieve required impedance matching, so as not to degrade system performance.

SUMMARY OF THE INVENTION

In accordance with the present invention, the above-described shortcomings of conventional device-level high temperature, moderate frequency thermosonic ball-bonding processes for system level interconnect applications, such as airborne and space-deployable antenna structures, are effectively overcome by a high frequency thermosonic ribbon bonding process, which maintains each of the ribbon bonding sites of the entirety of the system structure at a relatively reduced temperature, while at the same time applying an ultrasonic pulse to the ribbon which has a frequency lying within a prescribed frequency variation window that lies well above the conventional 60 KHz value described above.

By reduced temperature is meant a temperature that is no greater than the minimum temperature that would potentially cause a modification of (degrade) the circuit parameters of at least one of the system components. As a non-limiting example, such a minimum temperature may lie in a range on the order of 25–100° C., and preferably in a range of 25–85° C. The use of a reduced temperature, a relatively high frequency and a ribbon-configured conductor for a system level interconnect process provides a number of improvements over a conventional device-level thermosonic ball-bonding process, described above.

First, compared with a typical one mil metallic wire diameter, the generally rectangular physical geometry of a ribbon-configured conductor (such as a one mil by ten mil ribbon) provides a more mechanically robust conductive medium, and an enhanced bonding surface engagement area for greater metallurgical strength. Moreover, the generally flat or planar surface of ribbon-shaped conductor facilitates compliance with RF signal coupling requirements. Secondly, reducing the thermosonic bonding site temperature to value that is considerably less than the 150° C. temperature of a conventional ball-bonding process serves to inhibit unwanted modification of the internal circuit properties of system components.

In accordance with a preferred embodiment of the invention, an underlying support structure upon which the system is mounted during the ribbon bonding process is employed as a convection heat source, having an output heat flow that is directed upwardly through the system hardware, so as to maintain various topside bonding sites at temperature less than 100° C., preferably in a range of from 25° C. to 85° C. With the thermosonic bonding temperature reduced to a level (well below 150° C.) that avoids altering the design parameters of any system circuit components, we have found that the vibrational frequency of the ultrasonic bonding head needs to be increased to a frequency that will achieve the requisite atomic diffusion bonding energy, yet will not cause fracturing or destruction of the ribbon or its interface with the low temperature bond sites. To this end, we have found that such an elevated ultrasonic bonding frequency should be above 120 KHz and preferably in a range of from 122 KHz to 140 KHz.

This combination of low bonding site temperature, high ultrasonic frequency and ribbon configured interconnect material makes it possible not only to perform thermosonic bonding between metallic sites that are effectively located in the same (X-Y) plane, e.g., between planar surface-mounted packages, but between bonding sites that are located in different planes, namely having a measurable Z component therebetween. As a non-limiting example, these latter bonding sites may include wrap-around bonding terminals located at respective ends of signal processing circuit modules supported between and whose principal physical orientation is essentially orthogonal (i.e., along in the Z direction) to a generally planar (X-Y) support surface containing a distribution of signal processing or antenna feed components, such as the structure described in the above-referenced co-pending Wilson et al application. By locating bonding pads along edge regions of such planar-mounted components and with terminals projecting from end portions of modules that are mounted between the parallel support surfaces, any minor Z-axis offset can be readily bridged by the thermosonically bonded ribbon process of the present invention.

DETAILED DESCRIPTION

Figure 1:
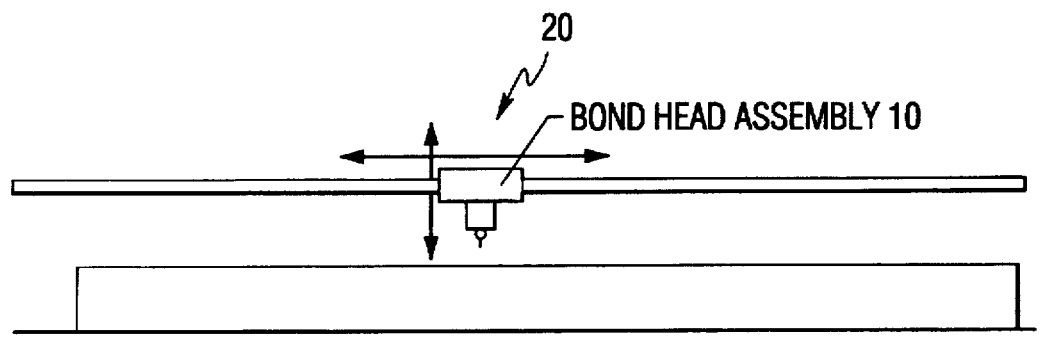
FIG. 1 diagrammatically illustrates a low temperature, high frequency thermosonic ribbon bonding apparatus in accordance with a preferred embodiment of the present invention.
Figure 2:
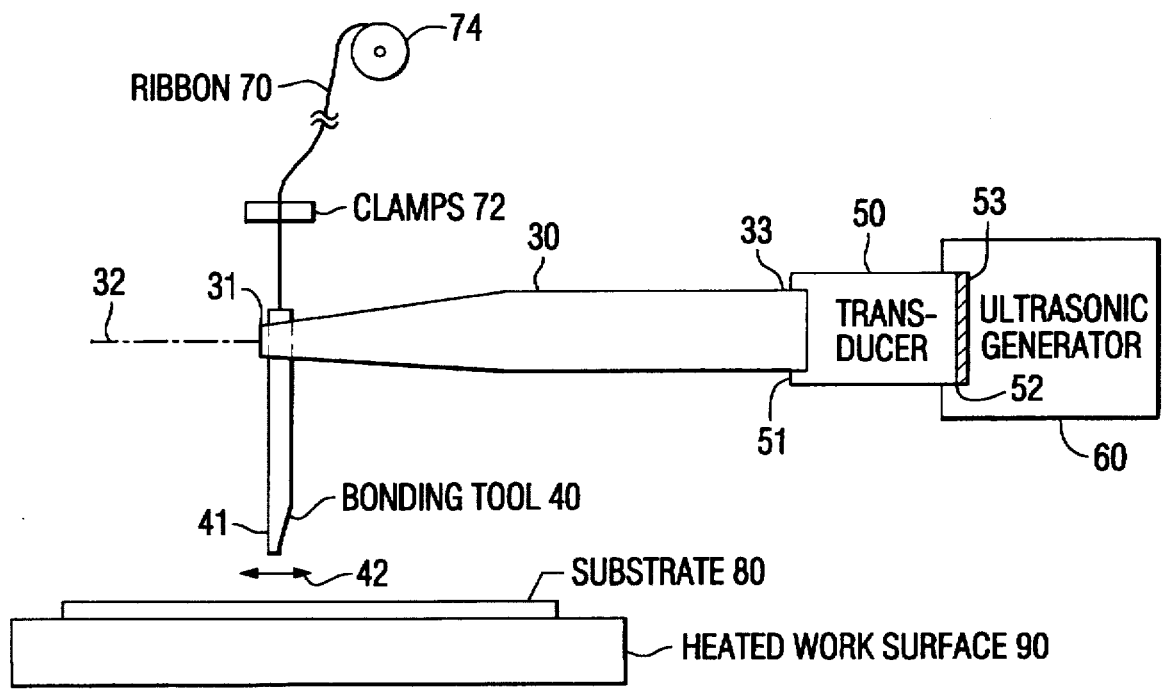
FIG. 2 shows the general configuration of a bonding head assembly of the apparatus of FIG. 1.

Referring to FIG. 1, a low temperature, high frequency thermosonic ribbon bonding apparatus in accordance with a preferred embodiment of the present invention is diagrammatically illustrated as comprising a bonding head assembly 10, supported and controllably positioned by a three-dimensional translation system, such as the end effector of a robotic manipulator system 20. As shown in FIG. 2, the bonding head assembly 10 preferably includes a tool support arm or horn 30, having its distal end 31 supporting a wedge-configured bonding tool 40, such as a titanium carbide wedge-configured tool, supported in an orientation that is generally orthogonal to the longitudinal vibrational axis 32 of the tool support arm 30. The components of which the bonding head assembly is made may be those available from commercial manufacturer's, such as Palomar Products, Verity, and Kulicke & Soffa, and being sized and dimensioned in accordance with the description herein to effect feeding of a one mil by ten mil gold ribbon-configured conductor, and effect a bond site ultrasonic vibration of the ribbon at a frequency on the order of 122–140 KHz, as will be described.

A compressional wave-launching transducer 50, such as a piezoelectric (PZT) element stack, has a first end portion 51 thereof affixed to an interior end face 33 of the tool support arm 30. Mounted to a second end surface 52 of transducer 50 is an energizing electrode 53, which is coupled to an ultrasonic generator 60. Ultrasonic generator 60 is operative to generate a high frequency voltage signal, lying within a prescribed frequency range to be described. In response to the application of this high frequency voltage to its energizing electrode 53, transducer 50 launches an ultrasonic compressional wave that propagates through the tool support arm 30 to its distal end 31. This compression wave travelling through the support arm causes ultrasonic vibrational back-and-forth translation of the wedge-configured distal end 41 of the wedge-configured bonding tool 40, in a direction parallel to the longitudinal vibrational axis 32 of the tool support arm 30, as shown by double arrowhead line 42.

Figure 3:
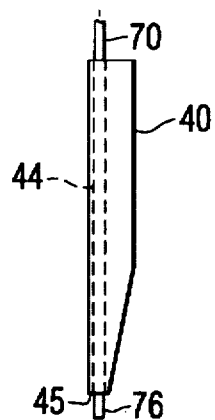
FIG. 3 diagrammatically illustrates the configuration of the bonding tool of the bonding head assembly of FIG. 2.

As shown in greater detail in FIG. 3, the bonding tool 40 may have a bore, diagrammatically shown at 44, through which a ribbon-configured conductor 70, such as a length of 1 mil by ten mil gold ribbon wire, is fed. Alternatively, the conductor may be fed down one side of the exterior surface of the bonding tool. As shown further in FIG. 2, ribbon 70 is fed through a vertically translatable controlled clamp member 72 from a ribbon supply reel, shown diagrammatically at 74. Clamp member 72 is operative to close upon and thereby clamp the ribbon 70, so that the ribbon may be urged downwardly or upwardly through the ribbon feed bore 44 of the tool 40. When advancing the ribbon toward a bonding site, as the clamp member 72 pulls the ribbon from the supply reel 74 it urges the ribbon into and through the feed bore 44, so that an end portion 76 of the ribbon 70 projects vertically downward from a lower end face 45 of the tool 40.

Figure 4:
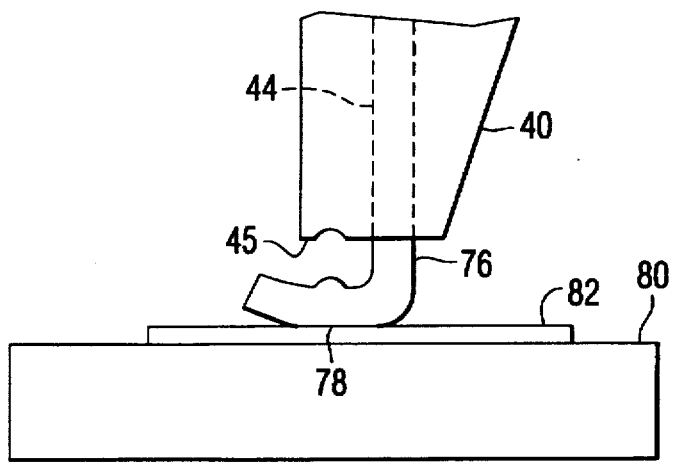
FIG. 4 illustrates the manner in which a ribbon conductor projects vertically downward from a lower end face of the wedge-configured bonding tool of FIG. 3.

As diagrammatically illustrated in FIG. 4, this projecting end portion 76 of the ribbon is brought into engagement with a bond site 82 of a work piece 80, such as a metallic (e.g., gold) tab of a circuit substrate or module, that has been heated to a reduced thermosonic temperature. As a non-limiting example, bond site 82 may comprise a 17 mil×40 mil gold layer patterned atop a co-fired ceramic substrate, and serving as a portion an RF signal distribution network of an antenna structure.

As pointed out above, such an antenna structure may be of the type described in the above referenced co-pending Wilson et al patent application. In accordance with the antenna structure described in such co-pending application, RF signal processing (amplifier, impedance/phase-control) modules are embedded within a honeycomb-configured framework structure of respective antenna panels, such that a respective RF signal processing module is oriented generally orthogonal to the surface of each of a pair of generally flat panels that are mounted to opposite sides of the honeycomb support structure.

The outer surface of one of the antenna panels serves as a signal distribution network, DC power and control signal feed for the antenna, while the outer surface of the other panel supports a plurality or array of patch antenna elements. Orienting the honeycomb-embedded RF signal processing modules in a direction that is generally orthogonal to the planar surface of each antenna panel not only provides a very compact nesting of the modules within the support structure—thereby saving panel real estate for supporting the signal processing electronics, but also significantly reduces the transmission line coupling distances between the input/output ports of the signal processing modules and the antenna elements and signal distribution networks on the spaced apart antenna panels.

The thermosonic ribbon bonding process of the present invention is readily suited to provide secure, low loss interconnections between the input/output port terminals at opposite ends of the signal processing modules and conductive bond site locations of metallic traces on each of the antenna panels, which bond site locations are located immediately adjacent to the input/output port terminals.

Namely, as pointed out previously, the thermosonic bonding process described herein not only performs thermosonic bonding between sites that are effectively located in the same (X-Y) plane, e.g., between components mounted on the surfaces of the antenna panels, but between sites that are located in different planes, namely having a Z component therebetween. Thus, for the antenna structure of the above-referenced co-pending application, these bonding sites may include 'wrap-around' bonding terminals located at respective ends of signal processing modules supported between and whose principal physical orientation is essentially orthogonal (i.e., along in the Z direction of each panel) to a generally planar (X-Y) support surface containing a distribution of signal distribution or antenna element components of the outer antenna panel surfaces. With the wrap-around bonding pads of the signal processing modules located along edge regions of such planar-mounted components and essentially coplanar with terminals projecting from end portions of modules mounted between the parallel panels, ribbon bonding between the module input/output ports and the respective antenna and signal distribution panels on either side of the support substrate is readily effected.

A programmable force generated by the bonding head assembly 10 as concentrated at the distal tip 41 of the wedge tool 40 from which the ribbon 70 extends creates a pressure between the ribbon and the bond site 82. This pressure between the ribbon and the metal of the bond site may vary in accordance with the materials used. Based upon our analysis of various materials, for the non-limiting example of bonding a one mil by ten mil gold ribbon conductor to a gold tab of the surface of a substrate, such as those listed below, the applied pressure preferably lies within a range on the order of 90 to 136 grams.

The substrate or work piece 80 may comprise both metallic materials and organic and non-organic materials used in microelectronic circuits, such as but not limited to soft substrate materials, such as polyimide, duroid, BT resin, and ultralam, and the like, and hard materials such as aluminum, kovar, co-fired ceramic, and the like.

As shown in FIG. 2, the work piece 80 is preferably heated by means of a convection heat source that is installed in an underlying support structure 90 upon which the work piece 80 is mounted, and directing heated fluid (air) upwardly through and around the work piece (system architecture), so that the temperature of the bonding sites is within a preferred range of reduced thermosonic temperature.

As described above, by reduced thermosonic temperature is meant a temperature no greater than the minimum temperature that would potentially cause a modification of the circuit parameters of at least one of the system components of the system to which the thermosonic bonding process of the invention is applied. Such a minimum temperature may lie in a range that is preferably no higher than 100° C. Pursuant to a preferred embodiment of the invention, the temperature of the bonding sites is maintained in a range of from 25° C. to 85° C., so as to prevent altering the design parameters of system circuit components.

With the projecting end 76 of the ribbon 70 urged into frictional engagement with the heated bonding site 82, a high frequency ultrasonic pulse (e.g., on the order of one to three watts) applied to the tool holder 30 by ultrasonic signal generator 60 and transducer 50 causes the wedge tool 40 to impart a corresponding high frequency ultrasonic vibration of the projecting end 76 of the ribbon 70 for the duration of the pulse (e.g., in a range on the order of from 15 to 1200 milliseconds, depending upon the substrate material). This high frequency pulsed vibration of the end of the ribbon 70 imparts an ultrasonic scrubbing action of its end face 78 against the bonding tab 82, to effect atomic monometallic diffusion bond between the end of the (gold) ribbon and the (gold) bonding tab 82.

As pointed out above, in addition to reducing the thermosonic bonding temperature reduced to a temperature level that avoids altering the design parameters of system circuit components, the frequency of the pulse of ultrasonic energy applied to the bonding tool 40 is increased to a value that is sufficiently high to impart atomic diffusion bonding energy to the bonding metal interface, yet is not so high as to cause fracturing or destruction of the ribbon 70 or its interface with the metal of the bond tab 82. Empirical analysis has revealed consistently strong and defect free thermosonic bonds for the entire variety of soft and hard substrate materials listed above for an ultrasonic bonding frequency in the range of from 122–132 KHz and up to 140 KHz for a hard substrate material, such as co-fired ceramic.

Figure 5:
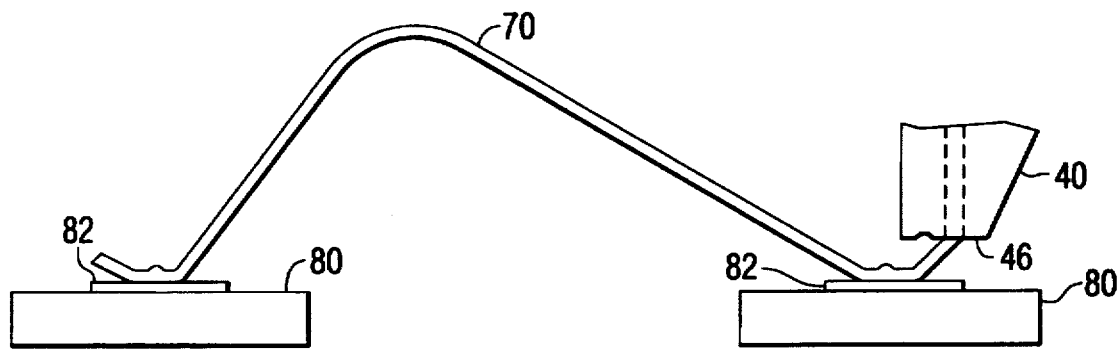
FIG. 5 shows the engagement of free end of a bonded ribbon conductor with a further bonding site by the wedge-configured bonding tool of FIG. 3.
Figure 6:
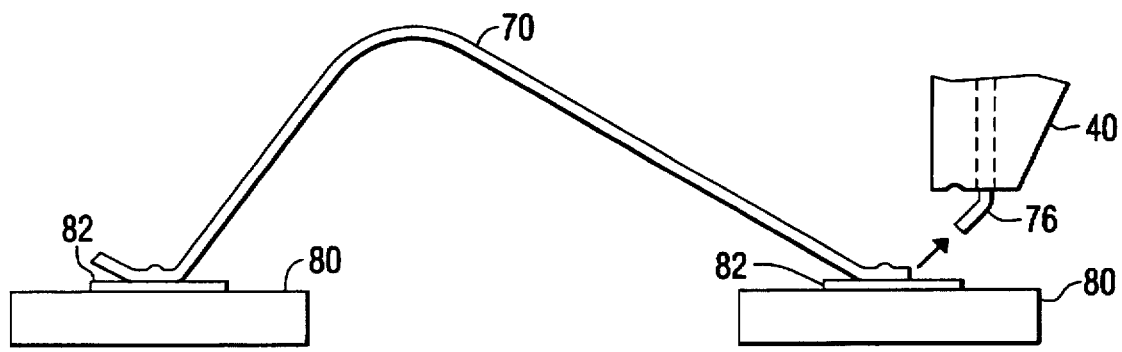
FIG. 6 shows the manner in which a controlled clamp element severs a free end of a ribbon conductor from a bonding site.

When the first bond has been completed, the clamp member 72 is released, allowing the ribbon 70 to pass through the bore 44 in the wedge tool 40 as the wedge tool is (X,Y,Z) translated by the robotic manipulator used for the bonding head assembly to another bonding site. At this further bonding site, the ribbon 70 projecting from the end face 46 of the wedge tool 40 is urged into frictional engagement with the bonding site, as diagrammatically illustrated in FIG. 5. Again, as with the first bond, another high frequency ultrasonic pulse is applied to the tool holder, causing the wedge tool 40 to again impart a pulse of high frequency ultrasonic vibration to the projecting end of the ribbon 70 for the duration of the pulse, and thereby form an atomic monometallic diffusion bond between the end of the ribbon and the bonding tab. As shown in FIG. 6, upon completion of the second bond, the clamp 72 pulls the free end of the ribbon upwardly away from the second bond site, thereby severing the ribbon via the end face 46 of the tool and completing the interconnect between the two bonding sites.

The resulting thermosonic ribbon bonds yield a mean pull strength comparable to that obtained by bonding a same sized ribbon at the conventional operational parameters of 60 KHz and 150° C. used for thermosonic ball bonding of an individual die, described above. If necessary, to make the thermosonic ribbon bonds more robust against severe mechanical stress, as in the case of significant physical handling or harsh storage, transportation and operating conditions, described above, one or more selected thermosonic ribbon bonds may be augmented by the addition of conductive epoxy to the completed monometallic joints.

As will be appreciated from the foregoing description, the shortcomings of conventional device-level high temperature, moderate frequency thermosonic ball-bonding processes to system level interconnect applications are effectively overcome by the high frequency thermosonic ribbon bonding process of the present invention, which maintains each of the ribbon bonding sites of the entirety of the system structure at a relatively reduced temperature, that is no greater than the minimum temperature that would potentially cause a modification of the circuit parameters of at least one of the system components. The range of magnitude of the higher frequency (on the order of from 122 KHz to 140 KHz) is sufficient to achieve atomic diffusion bonding energy, without causing fracturing or destruction of the ribbon or its interface with the low temperature bond sites.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of bonding a ribbon conductor to conductive bonding sites of a plurality of components of a support structure, said components having characteristics which become degraded at a temperature above a prescribed temperature, comprising the steps of:
    (a) heating said support structure to a temperature no greater than said prescribed temperature;
    (b) bringing a respective section of said ribbon conductor into contact with a respective one of said conductive bonding sites, and ultrasonically vibrating said respective section of said ribbon conductor to effect a thermosonic bond of said respective section of said ribbon conductor to said respective one of said conductive bonding sites; and
    (c) repeating step (b) for additional ones of said conductive bonding sites.

2. A method according to claim 1, wherein step (b) comprises ultrasonically vibrating said respective section of said ribbon conductor at a frequency that will achieve atomic diffusion bonding, but will not cause fracturing or destruction of said ribbon conductor or its interface with an associated bonding sites.

3. A method according to claim 1, wherein step (b) comprises ultrasonically vibrating said respective section of said ribbon conductor at a frequency above 120 KHz.

4. A method according to claim 1, wherein step (a) comprises heating said structure including said conductive bonding sites to a temperature no greater than 100° C.

5. A method according to claim 1, wherein step (a) comprises heating said structure including said conductive bonding sites to a temperature lying in a range of from 25° C. to 100° C., and step (b) comprises ultrasonically vibrating said respective section of said ribbon conductor at a frequency lying in a range of from a frequency above 120 KHz to 140 KHz.

6. A method according to claim 1, wherein step (a) comprises heating said structure including said conductive bonding sites to a temperature lying in a range of from 25° C. to 85° C., and step (b) comprises ultrasonically vibrating said respective section of said ribbon conductor at a frequency lying in a range of from 122 KHz to 140 KHz.

7. A method according to claim 1, wherein step (a) comprises heating said support structure by way of convective heat flow from a convection heat source, so as to bring said bonding sites to said temperature no greater than said prescribed temperature.

8. A method according to claim 1, further including the step (c) of coating a respective thermosonically formed ribbon conductor bond with a conductive adhesive so as to increase the strength of said bond against mechanical stress.

9. An apparatus for bonding a ribbon conductor to conductive bonding sites of a plurality of components of a support structure, said components having characteristics which become degraded at a temperature above a prescribed temperature, comprising:
    a heat source which is operative to heat said support structure to a temperature no greater than said prescribed temperature;
    a bonding head assembly, which is operative to bring a respective section of said ribbon conductor into contact with a respective one of said conductive bonding sites, and imparts ultrasonic energy to said respective section of said ribbon conductor at a frequency that effects a thermosonic bond of said respective section of said ribbon conductor to said respective one of said conductive bonding sites.

10. An apparatus according to claim 9, wherein said bonding head assembly is operative to impart ultrasonic energy to said respective section of said ribbon conductor at a frequency above 120 KHz.

11. An apparatus according to claim 9, wherein said heat source is operative to heat said structure including said conductive bonding sites to a temperature no greater than 100° C.

12. An apparatus according to claim 9, wherein said heat source is operative to heat said structure including said conductive bonding sites to a temperature lying in a range of from 25° C. to 100° C., and said bonding head assembly is operative to ultrasonically vibrate said respective section of said ribbon conductor at a frequency lying in a range of from a frequency above 120 KHz to 140 KHz.

13. An apparatus according to claim 9, wherein said heat source is operative to heat heating said structure including said conductive bonding sites to a temperature lying in a range of from 25° C. to 85° C., and said bonding head assembly is operative to ultrasonically vibrate said respective section of said ribbon conductor at a frequency lying in a range of from 122 KHz to 140 KHz.

14. An apparatus according to claim 9, wherein said heat source comprises a convective heat source which is operative to heat said support structure by way of convective heat flow, so as to bring said bonding sites to said temperature no greater than said prescribed temperature.

15. An apparatus according to claim 9, wherein said bonding head assembly is supported and controllably positioned by a three-dimensional translation system.

16. An apparatus according to claim 9, wherein said bonding head is operative to impart said ultrasonic energy to said respective section of said ribbon conductor for a prescribed period of time.

17. An apparatus according to claim 16, wherein said bonding head is operative to impart ultrasonic energy in a frequency range on the order of 122 KHz to 140 KHz for a duration lying in a range on the order of from 15 to 1200 milliseconds.

18. An apparatus according to claim 9, wherein said bonding head assembly comprises a tool support arm, having a distal end supporting a bonding tool in an orientation that is generally orthogonal to a longitudinal vibrational axis of said tool support arm, said tool support arm having a second end thereof coupled to receive an ultrasonic compressional wave launched by an ultrasonic wave emitting transducer, and wherein said ribbon conductor is fed through said bonding tool into engagement with a respective bonding site, such that said ultrasonic compressional wave launched by said transducer propagating through said tool support arm to said distal end thereof causes ultrasonic vibrational translation of a distal end of said bonding tool and a ribbon conductor captured thereby, so as to effect an atomic diffusion bond between said ribbon conductor and a respective bonding site.

19. An apparatus according to claim 18, wherein said bonding tool has a bore through which said ribbon-configured conductor is fed by a controlled clamp member, which is operative to controllably grip and urge said ribbon conductor inwardly or outwardly through said ribbon feed bore of said bonding tool.

20. An apparatus according to claim 19, wherein said bonding head assembly is operative to exert a prescribed pressure between the ribbon conductor and said respective bonding site.

21. An apparatus according to claim 20, wherein said prescribed bonding pressure lies within a range on the order of 90 to 136 grams.

* * * * *